United States Patent [19]

Stipanuk

[11] Patent Number: 4,730,277
[45] Date of Patent: Mar. 8, 1988

[54] CIRCUIT FOR BIASING ROW OF MEMORY CELLS

[75] Inventor: James J. Stipanuk, Chandler, Ariz.

[73] Assignee: Motorola, Inc., Schaumburg, Ill.

[21] Appl. No.: 809,617

[22] Filed: Dec. 16, 1985

[51] Int. Cl.⁴ .......................... G11C 7/00; G11C 8/00; G11C 11/34

[52] U.S. Cl. .................................. 365/189; 365/230; 365/179

[58] Field of Search ............... 365/203, 189, 230, 227, 365/228, 179

[56] References Cited

U.S. PATENT DOCUMENTS

| 4,488,268 | 12/1984 | Toyoda | 365/203 |
| 4,601,014 | 7/1986 | Kitano et al. | 365/230 |
| 4,627,031 | 12/1986 | Van Tran | 365/203 |

*Primary Examiner*—Terrell W. Fears
*Assistant Examiner*—Melissa J. Koval
*Attorney, Agent, or Firm*—William E. Koch

[57] ABSTRACT

A circuit for selecting a row of memory cells of an array is disclosed that reduces selection time, eliminates the need for providing a regulated voltage for biasing an active load, and utilizes the capacitive charge on the lower word line in the selection of the row. The array includes a first voltage terminal, a second voltage terminal, a plurality of word lines, a plurality of bit lines, and a plurality of memory cells, wherein the plurality of memory cells are arranged in a matrix of rows and columns. Each of the cells in a row are coupled between the first voltage terminal and a word line, and each of the cells in a column are coupled between a pair of the bit lines. A word line driver circuit is coupled between bases of active load transistors in each of the memory cells in a row and the word line of that row for selecting that row of memory cells.

6 Claims, 2 Drawing Figures

CIRCUIT FOR BIASING ROW OF MEMORY CELLS

FIELD OF THE INVENTION

This invention relates generally to memory cells and, more particularly, to a circuit for biasing a row of bipolar memory cells that reduces selection time, eliminates the need for providing a regulated voltage for biasing an active load, and utilizes the capacitive charge on the lower word line in the selection of the row.

BACKGROUND OF THE INVENTION

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

Conventionally, a row of cells is selected when increased voltage is supplied to the upper word line. A particular cell in that row is read by a sense amplifier coupled to the bit lines. A first read current through one bit line flows directly from the sense amplifier. A second read current through the other bit line flows through one side of the memory cell from the upper word line. When a cell is written, the first read current is directed through the cell and the second read current is directed from the sense amplifier.

The row rise time and therefore the row access time is limited by the AC response time of the cell, which if exceeded, will cause the cell to switch states (disturb). This limit can be improved for a given cell by reducing the row swing or by enhancing the response time of the cell.

The cell response time is conventionally improved by increasing the cell current when the row is selected. The typical selection circuit comprises an NPN transistor having a collector coupled to a supply voltage, an emitter coupled to the upper word line, and a base coupled to receive a selection signal input for supplying a high (selected) or low (deselected) signal to the NPN transistor. A standby current source is coupled between the lower word line and ground for continously providing current to the cell. A select current source is coupled between ground and the cathode of a diode. An anode of the diode is connected to the lower word line and steers current from the select current source to the lower word line only when the row is selected. Thus, the current from the select current source flows through the cell when the row is selected and enhances the response of the memory cell.

However, the above method is insufficient for memory cells having current levels determined by a bias regulator voltage applied to bases of PNP transistors serving as active loads of the memory cell. An additional means for biasing the active load transistors must be provided. Typically, a voltage source provides a bias voltage to the load transistor bases for each row of cells. Preferrably, this voltage source would be able to sense whether a given row of memory cells was selected and adjust the current levels of the active load transistors accordingly. However, such a voltage source would require a complex voltage regulator design.

Therefore, a circuit configuration is needed for selecting a row of bipolar memory cells that reduces selection time, eliminates the need for providing a regulated voltage for biasing an active load, and improves the memory cell response time.

SUMMARY OF THE INVENTION

Accordingly, it is an object of the present invention to provide an improved selection circuit for bipolar memory cells.

Another object of the present invention to provide a selection circuit for bipolar memory cells having reduced selection time.

Yet another object of the present invention is to provide a bipolar memory circuit that eliminates the need for providing a regulated voltage for biasing an active load.

Still another object of the present invention is to provide a bipolar memory circuit that utilizes the capacitive charge on the lower word line in the selection of the row.

In carrying out the above and other objects of the invention in one form, there is provided a bipolar memory circuit including a first voltage terminal, a second voltage terminal, a plurality of word lines, and a plurality of bit lines, wherein the memory cells are arranged in rows and columns. Each of the cells in a row are coupled between the first voltage terminal and a word line, and each of the cells in a column are coupled between a pair of the bit lines, wherein each cell is uniquely coupled in a row and column. A word line driver circuit is coupled between bases of active load transistors in each of the memory cells in a row and the word line of that row for selecting that row of memory cells.

The above and other objects, features, and advantages of the present invention will be better understood from the following detailed description taken in conjunction with the accompanying drawing.

DETAILED DESCRIPTION OF THE INVENTION

Figure 1:
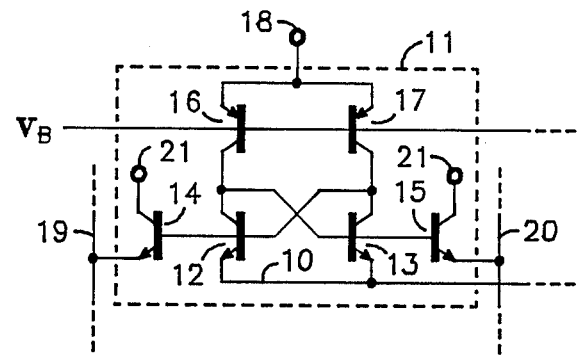
FIG. 1 is a schematic of a memory cell that may be used with the present invention.

Referring to FIG. 1, memory cell 11, that may be used with the present invention, is shown which is suitable to be fabricated in monolithic integrated circuit form. NPN transistors 12 and 13 have their emitters connected to word line 10 and their collectors connected to each other's base, to the bases of sense NPN transistors 14 and 15, respectively, and to the collectors of transistors 16 and 17, respectively. Transistors 16 and 17 each have an emitter connected to supply voltage terminal 18 and a base coupled for receiving bias voltage $V_{BB}$. Transistors 14 and 15 each have a collector connected to supply voltgage terminal 21 and an emitter connected to bit lines 19 and 20, respectively.

Figure 2:
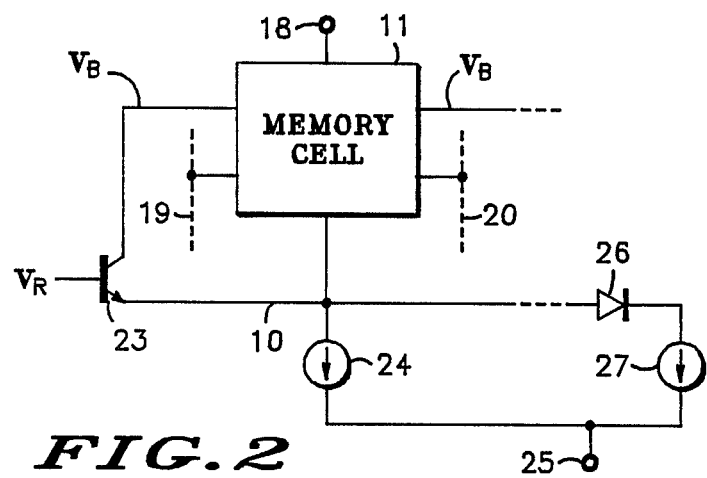
FIG. 2 is a schematic of the preferred embodiment of the invention.

Referring to FIG. 2, the preferred embodiment of the invention comprises NPN transistor 23 having a base coupled for receiving row select signal $V_R$, an emitter connected to word line 10, and a collector connected to the bases of active load transistors 16 and 17 (FIG. 1) of memory cell 11. Standby current source 24 is coupled between word line 10 and supply voltage terminal 25 for continously supplying current to word line 10. Diode 26 has an anode connected to word line 10 and a cathode coupled to supply voltage terminal 25 by select current source 28 for supplying additional current to word line 10 when the row of memory cells is selected.

In operation, standby current source 24 supplies current to word line 10 and the emitter of transistor 23. This causes current to flow from the collector of transistor 23 into the bases of each of the active load transistors of the memory cell 11. Current will then flow from the collectors of each PNP transistor 16 and 17 through memory cell 11 and back to word line 10, thus effectively stealing some of the current from standby current source 24 which was going to the emitter of transistor 23. This process reaches an equilibrium state in a predictable and controlled manner, with current from standby current source 25 apportioned in such a way that transistor 16 and 17 base currents flow through transistor 23 and transistor 16 and 17 collector currents flow through the memory cell directly to word line 10.

When row select signal $V_R$ goes high, a current surge flows from the parasitic capacitances associated with word line 10 into the emitter of transistor 23, the collector of transistor 23, and the bases of active load transistor 16 and 17, in turn. This current surge acts to rapidly charge the diffusion capacitances of transistors 16 and 17, thus rapidly increasing current levels in the selected cell and enhancing cell response.

By now it should be appreciated that there has been provided a circuit for biasing a row of bipolar memory cells that reduces selection time, eliminates the need for providing a regulated voltage for biasing an active load, and utilizes the capacitive charge on the lower word line in the selection of the row.

I claim:

1. A circuit for selecting a row of memory cells in an array of memory cells, said memory cells having a write mode for writing information into one of said selected memory cells, a low current mode for storing said information, and a read mode for reading said information in one of said selected memory cells, said array of memory cells including a first voltage terminal, a second voltage terminal, a plurality of word lines, a plurality of bit lines, wherein said memory cells are arranged in a matrix of rows and columns, each of said memory cells in a row coupled between said first voltage terminal and one of said word lines, each of said memory cells in a column coupled between a pair of said bit lines, each of said memory cells including a pair of load transistors and a transistor means, each load transistor having a base and coupled between said first voltage terminal and said transistor means, said transistor means being further coupled to said one of said word lines and said pair of bit lines for storing said information in response to a signal on said bit lines, a plurality of first means, each of said first means coupled between said one of said word lines of each of said rows and said second voltage terminal for sinking current from said one of said word lines during said write mode and said read mode, said circuit comprising:

a plurality of second means, each of said second means coupled between said one of said word lines of each of said rows and said second voltage terminal for sinking additional current from said one of said word lines during said write mode, said low current mode, and said read mode; and a plurality of third means, each of said third means coupled between a base of both of said pair of load transistors and said one of said word lines of each of said rows for selectively applying voltage to one of said word lines for selecting one of said word lines during said write modes and said read modes.

2. The circuit according to claim 1 wherein each of said third means comprises a transistor coupled between said bases of both of said pair of load transistors and one of said word lines and having a base coupled for receiving a row select signal.

3. A memory circuit including a first voltage terminal and a second voltage terminal, said memory circuit comprising:

a plurality of bit lines;

a plurality of word lines;

a plurality of memory cells, said memory cells having a write mode for writing information into one of said selected memory cells, a low current mode for storing said information, and a read mode for reading said information in one of said selected memory cells, wherein said memory cells are arranged in a matrix of rows and columns, each of said memory cells in a row coupled between said first voltage terminal and one of said word lines, each of said memory cells in a column coupled between a pair of said bit lines, each of said memory cells including a pair of load transistors, each load transistor having a base and coupled between said first voltage terminal and said transistor means, said transistor means being further coupled to said one of said word lines and said pair of bit lines for storing said information;

plurality of first means, each of said first means coupled between a base of both of said pair of load transistors and said one of said word lines of each of said rows for selectively applying voltage to said one of said word lines for selecting one of said word lines during said write modes and said read modes;

plurality of second means, each of said second means coupled between said one of said word lines and said second voltage terminal for sinking current from said one of said word lines during said write mode and said read mode; and plurality of third means, each of said third means coupled between said one of said word lines of each of said rows and said second voltage terminal for sinking additional current from said one of said word lines during said write mode, said low current mode, and said read mode.

4. The circuit according to claim 3 wherein each of said first means comprises a first transistor coupled between said base of both of said pair of load transistors and said word line and having a base coupled for receiving a row select signal.

5. The circuit according to claim 3 wherein said transistor means comprises:

a pair of latchable cross-coupled transistors having their emitters coupled to one of said word lines, their collectors coupled to said pair of load transistors, respectively, and their bases coupled to each other's collectors;

fourth means coupled between said second voltage terminal and one of said pair of bit lines and coupled to said base of one of said pair of latchable cross-coupled transistors for sourcing current to said bit line during said read and write modes; and fifth means coupled between said second voltage terminal and another of said pair of bit lines and coupled to said base of the other of said pair of latchable cross-coupled transistors for sourcing current to said bit line during said read and write modes.

6. The circuit according to claim 5 wherein said fourth and fifth means comprise a second transistor and a third transistor, respectively, each having a collector coupled to said second supply voltage terminal, an emitter coupled to said first and second bit lines, respectively, and a base coupled to said base of one of said pair of latchable cross-coupled transistors.

* * * * *